(12) United States Patent
Liess

(10) Patent No.: US 7,573,463 B2
(45) Date of Patent: Aug. 11, 2009

(54) APPARATUS EQUIPPED WITH AN OPTICAL KEYBOARD AND OPTICAL INPUT DEVICE

(75) Inventor: Martin Dieter Liess, Wiesbaden (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 357 days.

(21) Appl. No.: 10/525,487

(22) PCT Filed: Aug. 8, 2003

(86) PCT No.: PCT/IB03/03571

§ 371 (c)(1),
(2), (4) Date: Feb. 23, 2005

(87) PCT Pub. No.: WO2004/021158

PCT Pub. Date: Mar. 11, 2004

(65) Prior Publication Data

US 2006/0152494 A1  Jul. 13, 2006

(30) Foreign Application Priority Data

Aug. 29, 2002  (EP) .................................. 02078554

(51) Int. Cl.
  *G06F 3/02* (2006.01)
(52) U.S. Cl. ....................... 345/170; 345/168

(58) Field of Classification Search ................. 345/156, 345/157, 158, 163, 168, 173, 174, 175, 170; 250/221, 222.1, 224; 356/28.5, 496; 362/551, 362/554, 806; 385/12
See application file for complete search history.

(56) References Cited

U.S. PATENT DOCUMENTS

| RE33,422 E | * | 11/1990 | Garcia, Jr. ..................... 341/31 |
| 6,424,407 B1 | * | 7/2002 | Kinrot et al. .................. 356/28 |
| 6,525,677 B1 | * | 2/2003 | Printzis ....................... 341/31 |
| 6,552,713 B1 | * | 4/2003 | Van Brocklin et al. ...... 345/157 |
| 2002/0104957 A1 | * | 8/2002 | Liess et al. .................. 250/221 |

FOREIGN PATENT DOCUMENTS

| WO | 02/37411 | * | 5/2002 |
| WO | WO0237410 A1 | | 5/2002 |
| WO | WO 03/098527 | * | 5/2003 |
| WO | WO03098527 A2 | | 11/2003 |

* cited by examiner

*Primary Examiner*—Chanh Nguyen
*Assistant Examiner*—Pegeman Karimi

(57) ABSTRACT

An apparatus includes an optical keyboard and an optical input device controlled by a moving object. The input device has at least one diode laser and photo diode for supplying at least one measuring beam to a device window and for receiving radiation reflected by the object placed on the window. The input device may be integrated in the keyboard such that the measuring beam is guided via the positions of the keys to the window.

25 Claims, 11 Drawing Sheets

APPARATUS EQUIPPED WITH AN OPTICAL KEYBOARD AND OPTICAL INPUT DEVICE

This application is a 371 PCT/IB03/003571

BACKGROUND INVENTION

The invention relates to an apparatus comprising an optical input device controlled by a moving object and an optical keyboard, which input device comprises at least one optical sensor unit comprising a diode laser for supplying a measuring beam and converting means for converting measuring beam radiation reflected by the object into an electric signal, which converting means are constituted by the combination of a laser cavity and measuring means for measuring changes in operation of the laser cavity, which are due to interference of reflected measuring beam radiation re-entering the laser cavity and the optical wave in this cavity and which are representative of the movement of the object.

DESCRIPTION OF PRIOR ART

An optical keyboard is understood to mean a keyboard having movable keys (buttons) and a flat light guide arranged under the keyboard surface and provided with means to guide radiation along the positions of the keys and then to a radiation sensitive detector. Each key has a portion which, upon pushing the key, moves into a radiation path within the light guide and causes a change of the amount of radiation received by the detector via this radiation path.

The moving object is, for example a human finger, but may also be any object that is suitable to be moved over a transparent window of the input device.

The invention is especially intended for use in small hand-held apparatus, for example a mobile phone, a cordless phone, a hand-held computer, a personal digital assistant or a remote control, for example for a TV set. Such an apparatus comprises a flat display panel for displaying information either received from external sources or given in by the user or generated by a digital processor (internal microcomputer). The apparatus further comprises a keyboard for dial entry, i.e. chose a telephone number, and other functions, like activating software programs either stored in the digital processor or available from external sources to which the apparatus has access. For scrolling software menus and selecting a special program of such a menu, the apparatus is provided with an input device controlled by a finger of the user.

PCT patent application WO 02/037410 discloses an optical device of the type mentioned herein above. This input device uses the combination of a Doppler effect and so-called self-mixing effect in a diode laser. The latter effect is the phenomenon that radiation emitted by the diode laser and re-entering the laser cavity induces a variation in the gain of the laser and thus in the radiation emitted by the laser. In this device the window is illuminated by a skew laser beam, which has a component in the direction in which the finger is to be moved. If the finger is moved, the laser radiation scattered by the finger gets a frequency different from the frequency of the radiation illuminating the window and the finger, because of the Doppler effect. A portion of the scattered radiation is focussed on the diode laser by the same lens that focuses the illumination beam on the finger. Because some of the scattered radiation enters into the laser cavity through the laser mirror, in the laser cavity interference of radiation takes place. This gives rise to fundamental changes in the properties of the laser and the emitted radiation. Parameters, which change due to the self-mixing effect, are the power, the frequency and the line width of the laser radiation and the laser threshold gain. The result of the interference in the laser cavity is a fluctuation of the values of these parameters with a frequency that is equal to the difference between the frequency of the measuring beam and the frequency of the scattered radiation. This difference is equal to the velocity of movement of the finger or an object in general that is moved relative to the device window. Thus the velocity of the object and, by integration over time, the displacement of the object can be determined by measuring the value of one of said parameters. This measuring method can be carried out by means of only a few and simple components and does not require an accurate alignment of these components.

An optical keyboard requires one or more LED's (light emitting diodes) or other types of radiation sources and a corresponding number of radiation sensitive detectors. Each of the radiation sources is accommodated in an own housing and the space occupied by these housings and by the detectors may become a problem, especially in hand-held apparatus. Moreover the radiation sources are relative expensive components and consume much electrical energy. As in hand-held apparatus the energy is supplied by batteries, such batteries should be recharged rather frequently, which is annoying for the user.

It is an object of the present invention to provide a new concept of integration of the optical input device and an optical keyboard, which allows considerably reducing the number of components and improving the performance of the input device. According to the invention the apparatus is characterized in that the path of the measuring beam from the diode laser to the window extends through a light guide of the optical keyboard.

SUMMARY OF INVENTION

The apparatus is based on the insight that measuring beam of the input device can be used also for detecting whether a key of the optical keyboard is a pushed condition and on the insight that the reliability of the output signal of the input device can be considerably increased by increasing the distance between the diode laser and the device window. The diode laser of the input is arranged such that the measuring beam passes all key positions before it reaches the window of the input device.

An embodiment of the apparatus of which the input device allows a/o measuring of a scroll movement and click movement is characterized in that the input device comprises two sensor units, which are arranged relative to the optical keyboard such that the measuring beam of the first and second sensor unit passes on its way to the device window the positions of a first set of keys and the positions of a second set of keys, respectively, the first and second set together comprising all keys to be controlled.

As explained in WO 02/37410 and input device with two sensor units allows measuring of a click movement along a first axis and of a scroll movement along a second axis, as well as the direction of the scroll movement (up- or down-scroll). The measuring beams of the first and the second sensor units are used to determine the conditions (pushed or not) of the keys of the first and second set, respectively, which sets may comprise an equal number of keys.

An embodiment of the apparatus of which the input device allows a/o measuring a click movement and scroll movement in two different directions is characterized in that the input device comprises three sensor units, which are arranged relative to the optical keyboard such that the measuring beam of the first, the second and the third sensor unit passes on its way to the device window the positions of a first, a second and a third set of keys, respectively, the first, second and third set comprising all keys to be controlled.

Again, the measuring beams of the different sensor units are used to determine the conditions of the keys of the set associated with the sensor unit. An input device per se, which allows measurement along three axes, is described WO 02/37410, already mentioned.

A preferred embodiment of the apparatus is characterized in that the input device comprises a sensor unit adapted to measure both a scroll movement and a click movement and provided with additional means, which allow establishing the presence of an object on the window of the device.

This input device uses the recently obtained insight that hitherto unused information present in a sensor unit, which is used for measuring a scroll movement, can be used to determine the presence of a finger on the input window. If such a presence is established, it can be concluded that a click movement, which includes a short rest of the finger on the window, takes place. By using a same sensor unit for measuring both scroll and click movement, a sensor unit can be saved, which means costs and space reduction for the input device, and thus for the apparatus.

The presence of a finger or other object on the input device window can be determined by measuring amplitude variations of low frequency components in the sensor output signal, or variations in the electrical drive current for the diode laser of the sensor unit, or the pattern of undulations in the output signal.

When the preferred embodiment comprises only the adapted sensor unit, its measuring beam passes all positions of the keys of the keyboard. However, the preferred embodiment may comprise a second sensor unit, for example, for measuring a scroll action along a second axis or for generating redundancy in movement information to obtain a more reliable sensor signal and even a third sensor unit for said purposes. In such cases the measuring beams of the different sensor units control the conditions of different sets of keys.

There are several possibilities to measure changes in operation of the laser cavity, which results in different embodiments of the apparatus.

A first embodiment is characterized in that the measuring means are means for measuring a variation of the impedance of the laser cavity.

A preferred embodiment of the second main embodiment is characterized in that the measuring means is a radiation detector for measuring radiation emitted by the laser.

The radiation detector may be arranged in such a way that it receives part of the radiation of the measuring beam.

This embodiment of the input device is, however, preferably characterized in that the radiation detector is arranged at the rear side of the laser cavity.

The rear side of the laser cavity is understood to mean the side opposite the side (front side) where the measuring beam is emitted.

The apparatus comprising a second radiation-sensitive detector for measuring low-frequency components of modulated measuring radiation may be further characterized in that the second detector is arranged at the side of the laser cavity where the measuring beam is emitted.

For example, the second detector may be arranged between the diode laser and a lens of the input device either at a position where it receives radiation reflected by a component of the input device or at a position where it receives radiation split-off from the measuring beam.

The new assembly of optical keyboard and optical input device may be used in different applications, such as in a mobile phone, a cordless phone, a laptop computer, a hand-held computer, a keyboard for a desk computer and a remote control for a TV set.

BRIEF DESCRIPTION OF DRAWINGS

These and other aspects of the invention are apparent from and will be elucidated, by way of non-limitative example, with reference to the embodiments described hereinafter. In the drawings.

DETAILED DESCRIPTION

Figure 1A:
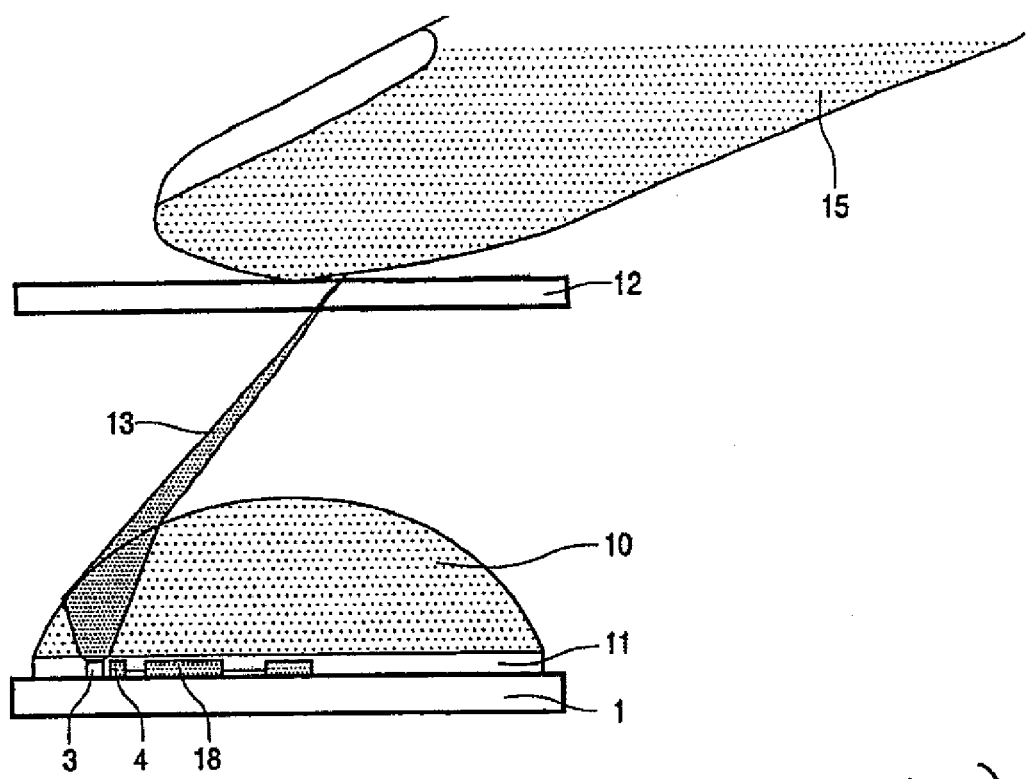
FIG. 1a shows, in a cross-section view, an embodiment of a known optical input device, which uses the self-mixing effect and by means of which the invention can be implemented.
Figure 1B:
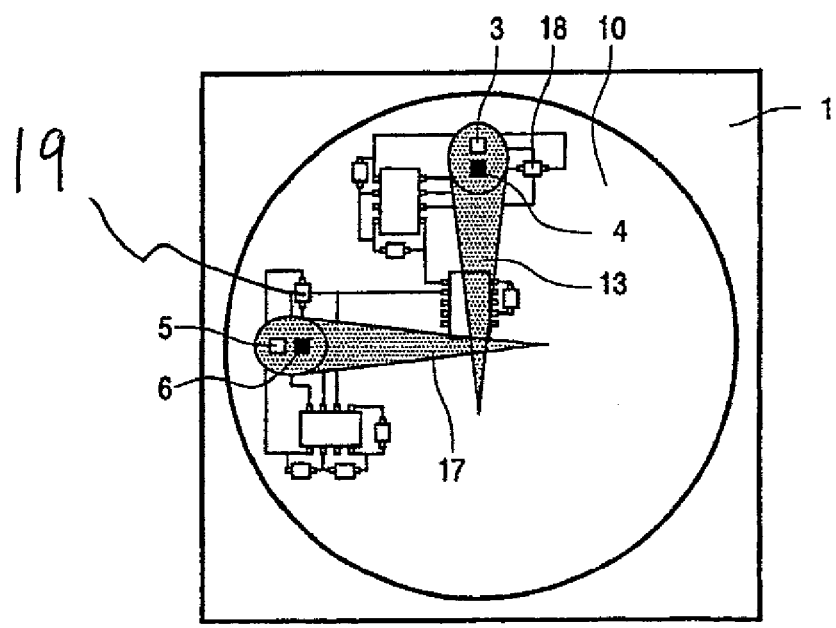
FIG. 1b shows a top view of this device.

FIG. 1a shows a diagrammatic cross-section of an embodiment of the known optical input device. The device comprises at its lower side a base plate 1, which is a carrier for the diode lasers, in this embodiment lasers of the type VCSEL, and the detectors, for example photo diodes. In FIG. 1a only one diode laser 3 and its associated photo diode 4 is visible, but at least a second diode laser 5 and associated detector 6 may be provided on the base plate, as shown in the FIG. 1b top view of the device. The diode lasers 3 and 5 emit laser, or measuring, beams 13 and 17, respectively At its upper side the device is provided with a transparent window 12 across which a human finger 15 is to be moved. A lens 10, for example a plane-convex lens is arranged between the diode lasers and the window. This lens focuses the laser beams 13 and 17 at or near the upper side of the transparent window. If an object, like the finger 15, is present at this position, it scatters the beam 13. A part of the radiation of beam 13 is scattered in the direction of the illumination beam 13 and this part is converged by the lens 10 on the emitting surface of the diode laser 3 and re-enters the cavity of this laser. As will be explained hereinafter, the radiation returning in the cavity induces changes in this cavity, which results in, inter alia, a change of the intensity of the laser radiation emitted by the diode laser. This is called the self-mixing effect. The intensity change due to the self-mixing effect can be detected by the photo diode 4, which converts the radiation variation into an electric signal. This signal is processed in an electronic circuitry 18. The circuitry's 18 and 19, shown in FIGS. 1a and 1b, for the signal of the photo diodes 4 and 6, respectively have only an illustrative purpose and may be more or less conventional. As is illustrated in FIG. 1b, the circuitry's may be interconnected.

Figure 2:
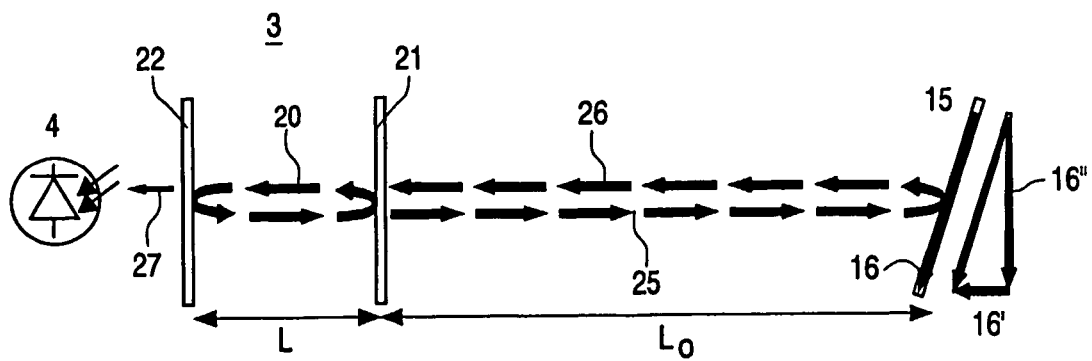
FIG. 2 shows the measuring principle of this input device.

FIG. 2 illustrates the principle of the input device and the method of measuring when a horizontal emitting diode laser and a monitor photo diode arranged at the rear facet of the laser are used. In this Figure, the diode laser, for example diode laser 3 is schematically represented by its cavity 20 and its front and rear facets, or laser mirrors, 21 and 22, respectively. The cavity has a length L. The object or finger, whose movement is to be measured, is denoted by reference numeral 15. The space between this object and the front facet 21 forms an external cavity, which has a length $L_0$. The laser beam emitted through the front facet, i.e. the measuring beam, is denoted by the reference numeral 25 and the radiation reflected by the object in the direction of the front facet is denoted by reference numeral 26. Part of the radiation generated in the laser cavity passes through the rear facet and is captured by the photo diode 4.

If the object 15 moves in the direction of the measuring beam 25, the reflected radiation 56 undergoes a Doppler shift. This means that the frequency of this radiation changes or that a frequency shift occurs. This frequency shift is dependent on the velocity with which the object moves and is of the order of a few kHz to MHz. The frequency-shifted radiation re-entering the laser cavity interferes with the optical wave, or radiation generated in this cavity, i.e. a self-mixing effect occurs in the cavity. Dependent on the amount of phase shift between the optical wave and the radiation re-entering the cavity, this interference will be constructive or negative, i.e. the intensity of the laser radiation is increased or decreased periodically. The frequency of the laser radiation modulation generated in this way is exactly equal to the difference between the frequency of the optical wave in the cavity and that of Doppler-shifted radiation re-entering the cavity. The frequency difference is of the order of a few kHz to MHz and thus easy to detect. The combination of the self-mixing effect and the Doppler shift causes a variation in the behavior of the laser cavity; especially its gain, or light amplification, varies.

Figure 3:
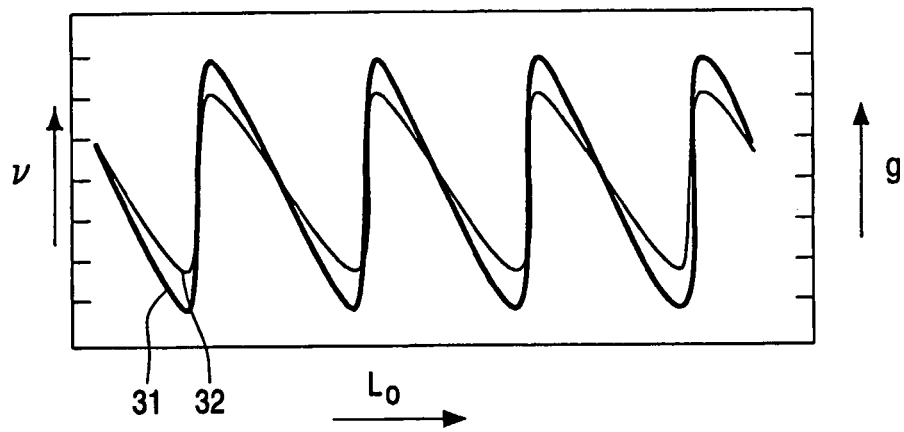
FIG. 3 shows the variation of the optical frequency and of the gain of the laser cavity as a function of the movement of the device and an object relative to each other.

This is illustrated in FIG. 3. In this Figure, curves 31 and 32 represent the variation of the frequency v of the emitted laser radiation and the variation of the gain g of the diode laser, respectively, as a function of the distance $L_0$ between the object 15 and the front mirror 21. Both v, g and $L_0$ are in arbitrary units. As the variation of the distance $L_0$ is the result of movement of the object, the abscissa of FIG. 3 can be re-scaled in a time axis, so that the gain will be plotted as a function of time. As explained in WO 02/37410, the gain variation Δg as a function of the velocity v of the object is given by the following equation:

$$\Delta g = -\frac{K}{L} \cdot \cos \cdot \left\{ \frac{4\pi \cdot \upsilon \cdot v \cdot t}{c} + \frac{4\pi \cdot L_0}{\lambda} \right\}$$

In this equation:

K is the coupling coefficient to the external cavity; it is indicative of the quantity of radiation coupled out of the laser cavity;

$\upsilon$ is the frequency of the laser radiation;

v is the velocity of the object in the direction of the illumination beam t is the moment of time, and c is the light velocity.

The object surface 15 is moved in its own plane, as is indicated by the arrow 16 in FIG. 2. Because the Doppler shift occurs only for an object movement in the direction of the beam, this movement 16 should be such that it has a component 16' in this direction. Thereby, it becomes possible to measure the movement in an XZ plane, i.e. the plane of drawing of FIG. 2 which movement can be called the X movement. FIG. 2 shows that the object surface has a skew position with respect to the rest of the system. In practice, usually the measuring beam is a skew beam and the movement of the object surface will take place in an XY-plane. The Y-direction is perpendicular to the plane of the drawing in FIG. 2. The movement in this direction can be measured by a second measuring beam, emitted by a second diode laser, and scattered light of which is captured by a second photo diode associated with the second diode laser. A (the) skew illumination beam(s) is (are) obtained by arranging the diode laser(s) eccentrically with respect to the lens 10, as shown in FIG. 1a.

Determining the variation of the laser cavity gain caused by the object movement by measuring the intensity of the radiation at the rear laser facet by a monitor diode is the simplest, and thus the most attractive way. Conventionally, this diode is used for keeping the intensity of the laser radiation constant, but now it is also used for measuring the movement of the object.

Figure 4:
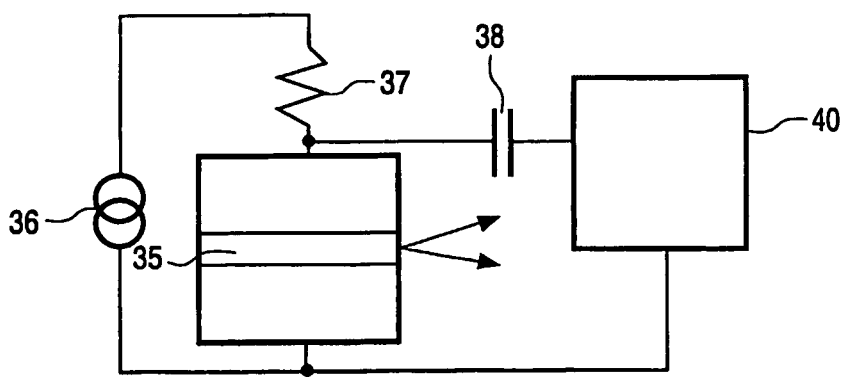
FIG. 4 shows a method of measuring this variation.
Figure 5:
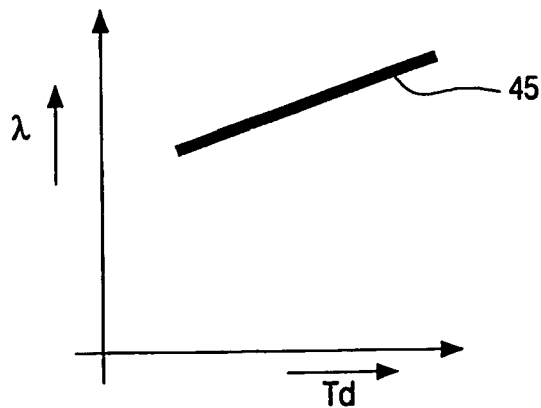
FIG. 5 shows the variation of laser wavelength as a function of the temperature of the laser with optical feedback.

Another method of measuring the gain variation, and thus the movement of the object, makes use of the fact that the intensity of the laser radiation is proportional to the number of electrons in the conduction band in the junction of the laser. This number in turn is inversely proportional to the resistance of the junction. By measuring this resistance, the movement of the object can be determined. An embodiment of this measuring method is illustrated in FIG. 4. In this Figure, the active layer of the diode laser is denoted by the reference numeral 35 and the current source for supplying this laser is denoted by reference numeral 36. The voltage across the diode laser is supplied to an electronic circuit 40 via a capacitor 38. This voltage, which is normalized with the current through the laser, is proportional to the resistance, or impedance, of the laser cavity. The inductance 37 in series with the diode laser forms high impedance for the signal across the diode laser.

Besides the amount of movement, i.e. the distance across which the object or finger is moved and which can be measured by integrating the measured velocity with respect to time, also the direction of movement has to be detected. This means that it has to be determined whether the object moves forward or backward along an axis of movement. The direction of movement can be detected by determining the shape of the signal resulting from the self-mixing effect. As shown by graph 32 in FIG. 3, this signal is an asymmetric signal. The graph 32 represents the situation where the object 15 is moving towards the laser. The rising slope 32' is steeper than the falling slope 32". As described in WO 02/37410, the asymmetry is reversed for a movement of the object away from the laser, i.e. the falling slope is steeper than the rising slope. By determining the type of asymmetry of the self-mixing signal, the direction of movement of the object can be ascertained. Under certain circumstances, for example for a smaller reflection coefficient of the object or a larger distance between the object and the diode laser, it may become difficult to determine the shape or asymmetry of the self-mixing signal.

Figure 6:
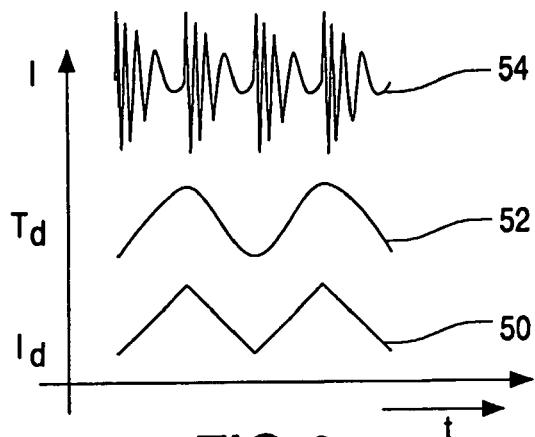
FIG. 6 shows the effect of the use of a periodically varying drive current for a laser.

Therefor, another method of determining the direction of movement is preferred. This method uses the fact that the wavelength λ of the laser radiation is dependent on the temperature of, and thus the current through, the diode laser. If, for example, the temperature of the diode laser increases, the length of the laser cavity increases and the wavelength of the radiation that is amplified increases. Graph 45 of FIG. 6 shows the temperature ($T_d$) dependency of the wavelength λ of the emitted radiation. In this Figure, both the horizontal axis, $T_d$, and the vertical axis, λ, are in arbitrary units.

If, as is shown in FIG. 6, a periodic drive current $I_d$, represented by the graph 50, is supplied to the diode laser, the temperature $T_d$ of the diode laser rises and falls periodically, as shown in graph 52. This results in a standing optical wave in the laser cavity which has a periodically varying frequency and thus a continuously varying phase shift with respect to the radiation reflected by the object and re-entering the cavity with a certain time delay. In every half period of the drive current, there are now successive time segments wherein the diode laser gain is higher and lower, respectively, depending on the phase relation of the wave in the cavity and the reflected radiation re-entering the cavity. This results in a time-dependent intensity variation (I) of the emitted radiation as shown in graph 54 of FIG. 6. This graph represents the situation for a stationary, or non-moving, object. The number of pulses in a first half period ½p(a) is equal to the number of pulses in a second half period ½p(b).

A movement of the object causes a Doppler shift of the radiation re-entering the laser cavity, i.e. the frequency of this radiation increases or decreases dependent on the direction of movement. A movement of the object in one direction, the upward-, or forward-, direction causes a decrease of the wavelength of the re-entering radiation, and a movement in the opposite direction, the downward-, or backward direction causes an increase in the wavelength of this radiation. The effect the periodic frequency modulation of the optical wave in the laser cavity has in case the Doppler shift has the same sign as the frequency modulation in the laser cavity is different from the effect in case said frequency modulation and Doppler shift have opposite signs. If the two frequency shifts have the same sign, the phase difference between the wave and the re-entering radiation changes at a slow rate, and the frequency of the resulting modulation of the laser radiation is lower. If the two frequency shifts have opposite signs, the phase difference between the wave and the radiation changes at a faster rate, and the frequency of the resulting modulation of the laser radiation is higher. During a first half period ½p(a) of the driving laser current, the wavelength of the generated laser radiation increases. In the case of a backward moving object, the wavelength of the re-entering radiation also increases, so that the difference between the frequencies of the wave in the cavity and that of the radiation re-entering this cavity is lower. Thus the number of time segments during which the wavelength of re-entering radiation is adapted to the wavelength of the generated radiation is smaller than in the case of absence of electrical modulation of the emitted laser radiation. This means that, if the object moves in the backward direction, the number of pulses in the first half period is smaller than if no modulation would be applied. In the second half period ½p(b), wherein the laser temperature and the wavelength of the generated radiation decrease, the number of time segments wherein the wavelength of the re-entering radiation is adapted to that of the generated radiation increases. Thus, for a backward moving object, the number of pulses in the first half period, i.e. during warming-up of the diode laser, is smaller than the number of pulses in the second half period, i.e. during cooling of the diode laser.

Figure 7:
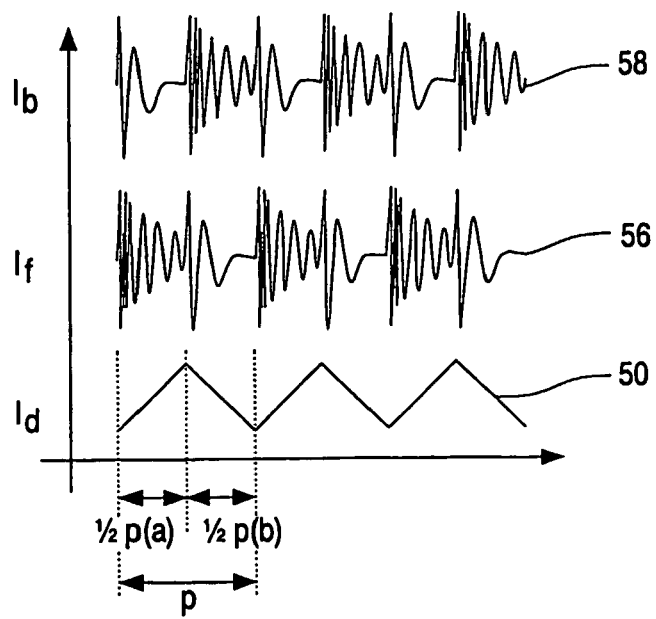
FIG. 7 shows how the direction of movement is detected.

This is illustrated in graph 58 of FIG. 7, which graph shows the intensity $I_b$ of the laser radiation emitted if the object moves in the backward direction. Comparing this graph with graph 54 of FIG. 6 shows that the number of pulses in the first half period has decreased and the number of pulses in the second half period has increased. If the object moves in the forward direction, whereby the wavelength of radiation scattered by the object and re-entering the laser cavity decreases due to the Doppler effect, the number of pulses in a first half period ½p(a) is larger than the number of pulses in a second half period ½p(b). This can be verified by comparing graph 56 of FIG. 7, representing the intensity $I_f$ of the radiation emitted in the case of a forward moving object with graph 54 of FIG. 6.

In an electronic processing circuit, the number of photo diode signal pulses counted during the second half period ½p(b) is subtracted from the number of pulses counted during the first half periods ½p(a). If the resulting signal is zero, the object is stationary. If the resulting signal is positive, the object moves in the forward direction and if this signal is negative, the object moves in the backward direction. The resulting number of pulses is proportional to the velocity of the movement in the forward and backward directions, respectively.

Under certain circumstances, for example if the optical path length between the laser and the object is relatively small and the frequency and amplitude of the electrical modulation are relatively small, whereas the movement to be detected is relatively fast, it may occur that the number of pulses generated by the Doppler effect is higher than the number of pulses generated by the electrical modulation. In such situations the direction of movement can still be detected by comparing the number of pulses during a first half period with the number of pulses during a second half period. However, the velocity is then not proportional to the difference of these two numbers. In order to determine the velocity in such situations, the said two numbers should be averaged and a constant value should be subtracted from the result. The number obtained in this way is a measure for the velocity. A person skilled in the art can easily design an electronic circuit for carrying out this calculation.

Instead of the triangular shaped drive current $I_d$ used in the embodiment described with reference to FIGS. 6 and 7, also a drive current of another shape, such as rectangular shape, may be used.

The method of measuring the velocity and the direction of the object movement described above can also be used if the gain variation is determined by measuring the variation of the resistance of the diode laser cavity.

The measuring method requires only a small Doppler shift, for example in terms of wavelength, a shift of the order of $1,5.10^{-16}$ m, which corresponds to a Doppler frequency shift of the order of 100 kHz for a laser wavelength of 680 mn.

Figure 8:
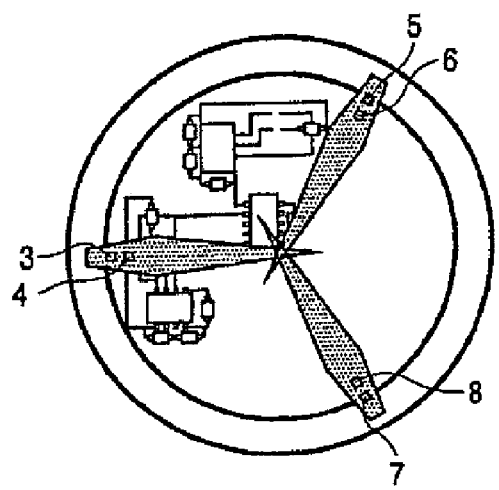
FIG. 8 shows a diagram of an optical input device with three measuring axes.

Object movements along two perpendicular (X and Y) directions, or measuring axes, in one plane can, be measured with the input device of FIGS. 1a and 1b, which device comprises two diode lasers and associated photo diodes in a perpendicular orientation. Adding a third diode laser and an associated photo diode to the device allows measuring also the movement along a third, Z-, direction, or measuring axis. The third diode laser may be arranged on the optical axis of the lens 10 so that the third illumination beam is perpendicularly incident on the window 12 and the object, or finger, 15 and has no components in the other directions. An optimum measuring signal for the Z direction may then be obtained. In order to increase the reliability and accuracy of the X and Y measuring signals, three diode lasers may be arranged on one circle and at a mutual angular distance of 120°. This configuration is shown in FIG. 8 wherein the third diode laser and third photo diode are denoted by the reference numerals 7 and 8, respectively. When the output signals of the photo diodes 4, 6 and 8, or the resistance measuring signals, are represented by $S_4$, $S_6$ and $S_8$ respectively, the object velocities $V_x$, $V_y$ and $V_z$ along the X, Y and Z measuring axes, respectively can be calculated, for example, as follows:

$$V_x = 2 \cdot S_4 - S_6 - S_8$$

$$V_y = \sqrt{3} \cdot (S_8 - S_6)$$

$$V_z = 1/\sqrt{2} \cdot (S_4 + S_6 + S_8)$$

The electronic circuit for performing this calculation comprises summing and subtracting elements and is relatively easy to implement.

The values of the velocities and, by integration with respect to time, duration of movement, the length of the movement in the X and Y directions obtained in this way are more reliable and accurate. For, they are the result of averaging the output signals of at least two photo diodes. Movement errors, or unwanted movements, such as slightly lifting the finger, have a similar effect on the output signals of the photo-diodes. As the movements along the X and Y measuring axes are determined by subtracting output signals from each other, the influence of an unwanted movement on the X- and Y-measuring signal is eliminated. Only the Z-measuring signal, $V_z$, which is obtained by adding the output signals of the three photo diodes is indicative of an up/down movement of the finger or another object.

In applications wherein the movement of a human finger in the Z direction and the input device relative to each other is used to perform a click function, it suffices to detect that such a movement takes place. An accurate measuring of the displacement of the object is not necessary so that the Z-measurement may be rather rough. Even the direction of the movement need not be detected.

Hardly any requirements have to be set to the structure or reflection coefficient of the finger. It has been demonstrated that also movement of a piece of blank or even black paper relative to the input device can easily be measured so that input to the device can also be given by another object than a finger.

In the input device, such as that shown in FIG. 8, the measuring beams preferably are not focused in the plane of the window. As these beam originate from different positions at the base plate level, the measuring beams form spots at different positions in the action plane, for example the plane of the window. The measuring beams and their scattered radiation are sufficient spatially separated, so the cross talk between the different measuring axes usually does not cause a problem. If necessary, residual cross talk can be reduced by using diode lasers with slightly different wavelengths. For this purpose, a wavelength difference of a few nm is already sufficient.

Another possibility of eliminating cross talk is use of a control drive for the diode lasers, which causes only one laser to be activated at any moment. A multiplexing driving circuit, which circuit alternately activates the different diode lasers, may constitute such a control drive. Such multiplexing circuit allows to monitor two or three diode lasers by means of one detector, or photodiode, which is arranged within reach of the radiation from each of the diode laser, and is used in a time sharing mode. An additional advantage of the embodiment with such a driving circuit is that the space needed for the circuitry and the electric power consumption of the device is reduced.

Figure 9:
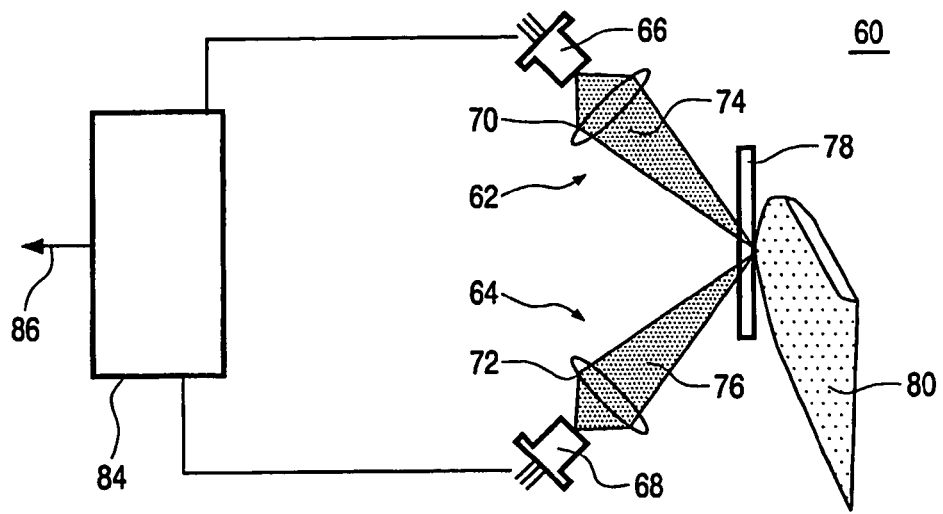
FIGS. 9 and 10 show an embodiment of a scroll-and-click-input device having two sensor units.

FIG. 9 shows the principle of an embodiment of optical input device, which is typically suited for measuring scroll and click movement. Such an input device can be used in an apparatus wherein menu charts are scrolled by a cursor on a display and a selected menu activated by a click. Such an input device, which may be called a scroll-and-click device.

Figure 10:
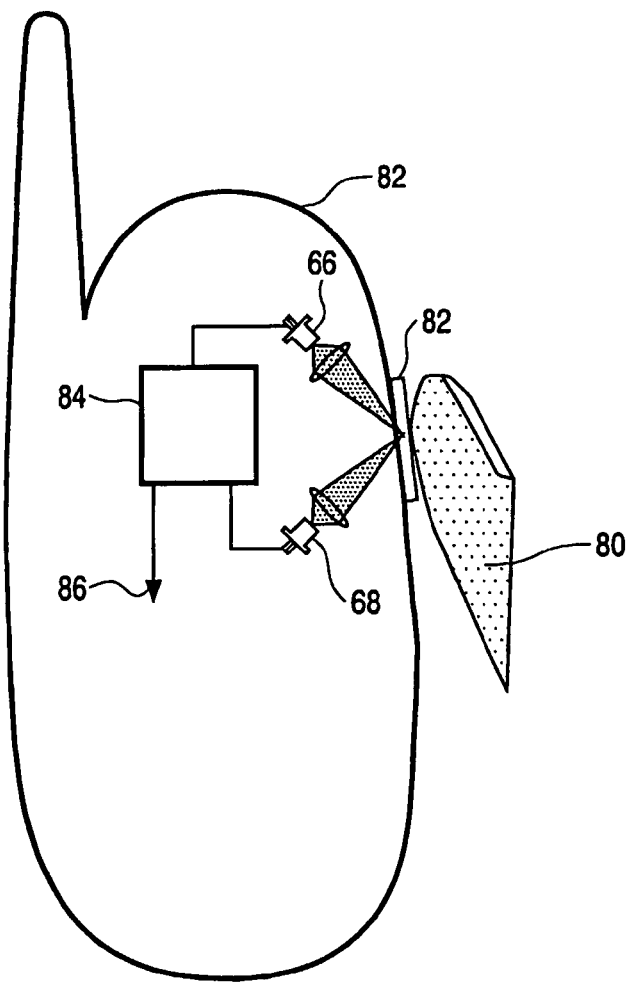

The scroll-and click device 60 of FIG. 9 comprises two optical sensor units 62, 64. Each sensor comprises a diode laser and photo diode assembly 66, 68. In the path of each of the measuring beams 74, 76 emitted by the diode lasers 66, 68 a lens 70, 72 may be arranged which focuses the associated beam in an action plane 78, which may be the plane of the device window. This window 88 may form part of the housing 82 of the apparatus in which the device is incorporated, for example a mobile phone as shown in FIG. 10. The diode lasers and the associated lenses are arranged such that the chief rays of the beams 62, 64 are at opposite angles with respect to the normal to the window 88, for example at angles of +45° and −45°, respectively.

The object or human finger 80 is moved across the action plane for a scrolling action and moved perpendicular to this plane for a clicking action. As described herein above, both actions cause a Doppler shift in the radiation reflected by the finger towards the diode laser and photo diode assemblies 66 and 68. The output signals of the detectors associated with these diode lasers are supplied to a signal processing and laser drive electronic circuitry 84. This circuitry evaluates the movements of, for example the controlling finger 80 and supplies information about the said movements at its output 86.

As described herein before a movement of a finger or other object towards an away from the laser/diode units may be detected by modulating the laser currents and counting the pulses received by the photo diodes. From the output signals $Sign_1$ and $Sign_2$ of these diodes, which represent velocities of the object along the chief rays of the beams 74, 76, respectively, the velocity ($V_{scroll}$) parallel to the window and the velocity ($V_{click}$) perpendicular to the window can be calculated as follows:

$$V_{scroll} = 1;2\sqrt{2} \cdot (Sign_1 - Sign_2)$$

$$V_{click} = 1;2\sqrt{2} \cdot (Sign_1 + Sign_2)$$

Figure 11:
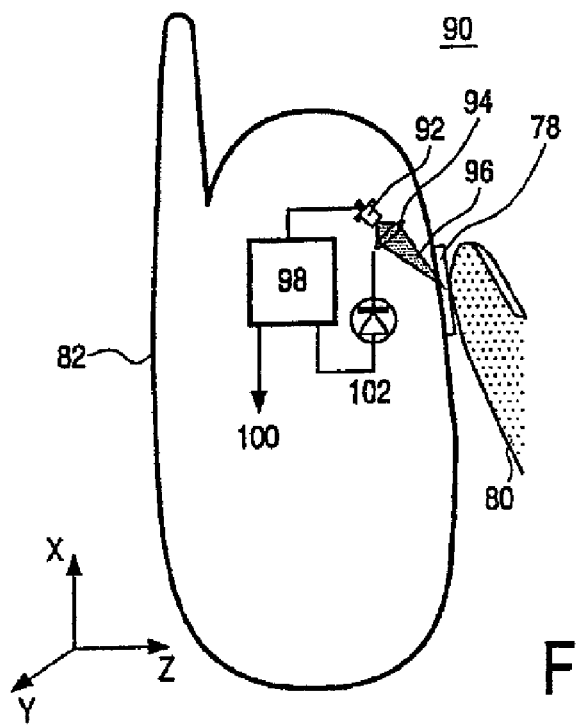
FIGS. 11 and 12 show an embodiment of a scroll-and-click-input device having one sensor unit.

FIG. 11 shows an embodiment of a scroll-and-click device 90, used in a mobile phone, which device comprises only one optical sensor unit. The single sensor unit comprises a diode laser and photo diode (monitor diode) assembly 92 and a lens 94 to converge the measuring beam from the diode laser on the window 78 of the input device. The monitor diode is connected to an electronic circuit 98, which processes the monitor output signal and controls the laser drive current. Reference number 100 denotes the output signal of this circuit or an interface to control functions of the apparatus outside the input device, like mobile phone menus. As the chief ray of the measuring beam is incident on the window at a sharp angel, it has a component both in the scroll direction X and the click direction Z. A scroll movement and a click movement will both cause a change in the measuring beam radiation reflected back in the laser cavity. To determine whether it is a scroll movement or a click movement that causes such a change, it is established whether the finger is resting or has rested on the window during a given time duration. If this is the case, it can be concluded that a click action is performed. For, such an action consists of a fast movement in the Z-direction of the finger toward the window, a window touch of the finger and a fast retracting of the finger from the window.

As remarked herein above, the frequency of the laser radiation modulation, which is due to finger movement across the window is dependent on circumstances and, for example, in the order of a few kHz to 1 MHz. It has been found that in case the finger rests on the window, the laser radiation will also be modulated, but at a frequency considerably lower than the scroll frequency. This low-frequency modulation can be detected by means of an additional detector (photo diode) denoted by 102 in FIG. 11, which is arranged such that it receives a portion of the modulated radiation. The amount of radiation incident on the photodiode 102 may be set by arranging a beam splitter (not shown), for example a partly reflection mirror, in the path of the measuring beam. This beam splitter reflects a fixed portion of the measuring beam radiation towards the additional photodiode. The additional photodiode is coupled to the laser drive and signal processing circuit 98. This circuit can thus establish whether a click action does occur or not, thus whether the measured movement is a click movement or a scroll movement.

Figure 12:
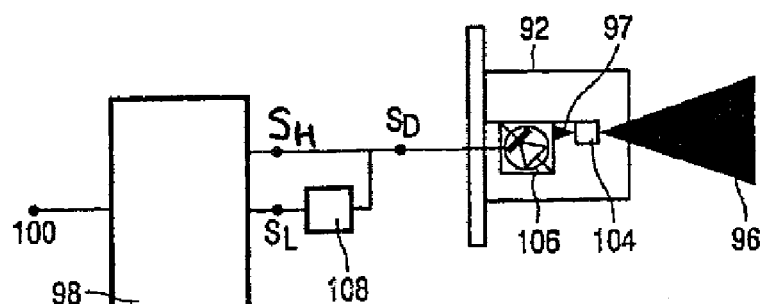

The occurrence of the low-frequency radiation modulation can also be detected by means of the monitor diode, as shown in FIG. 12. This Figure shows the assembly 92 comprising the diode laser 104 and the monitor diode 106 for receiving laser radiation 97 emitted at the rear side of the diode laser. A portion of the monitor diode signal $S_d$ is supplied to a low-pass filter 108 that passes only the low-frequency component $S_l$ to the signal processing circuit 100. The rest of the signal $S_d$ is supplied directly as signal $S_h$ to the circuit 98.

Again, in this circuit it is established whether a click movement occurs or not, i.e. whether a low-frequency amplitude variation occurs or not, thus whether the measured movement, i.e. the information of $S_h$ is a click movement or a scroll movement. It is also possible to supply the whole signal $S_d$ to the circuit 98 and that this circuit isolates the low-frequency component from the signal $S_d$.

During the time that the finger rests on the window, an opto-electronic feedback loop exists, which loop encompasses the diode laser and the device window, between which elements measuring beam radiation passes forth and back, the monitor diode and the laser drive circuit. The effect of coupling back laser radiation in the laser cavity is that the same amount of radiation is emitted at smaller laser drive electrical current. When a finger is present on the window the drive current decreases so that such a presence can be established by measuring this drive current, for example in the circuit of FIG. 4 or a similar circuit well known to a person skilled in the art. The result of such a measurement allows determining whether the movement measured with the monitor diode is a click movement or a scroll movement.

In case a pulsed diode laser is used, the presence of a finger on the device window can also be established by means of counting the number of undulations in the detector signal occurring in the first and second half of a laser drive current period. As explained at the hand of FIGS. 6 and 7, the number of undulations in a first half period will be equal to the number of undulations in the second half period if the finger rests on the window.

Each of the embodiments of the method to detect the presence of a finger on the input window described herein above may be combined with one or more of the other embodiments to obtain redundancy and thus to increase the reliability of the measurement.

Each of these embodiments may also be used in combination with one of the methods of measuring the variations in the laser cavity due to the self-mixing effect and the Doppler shift.

Figure 13:
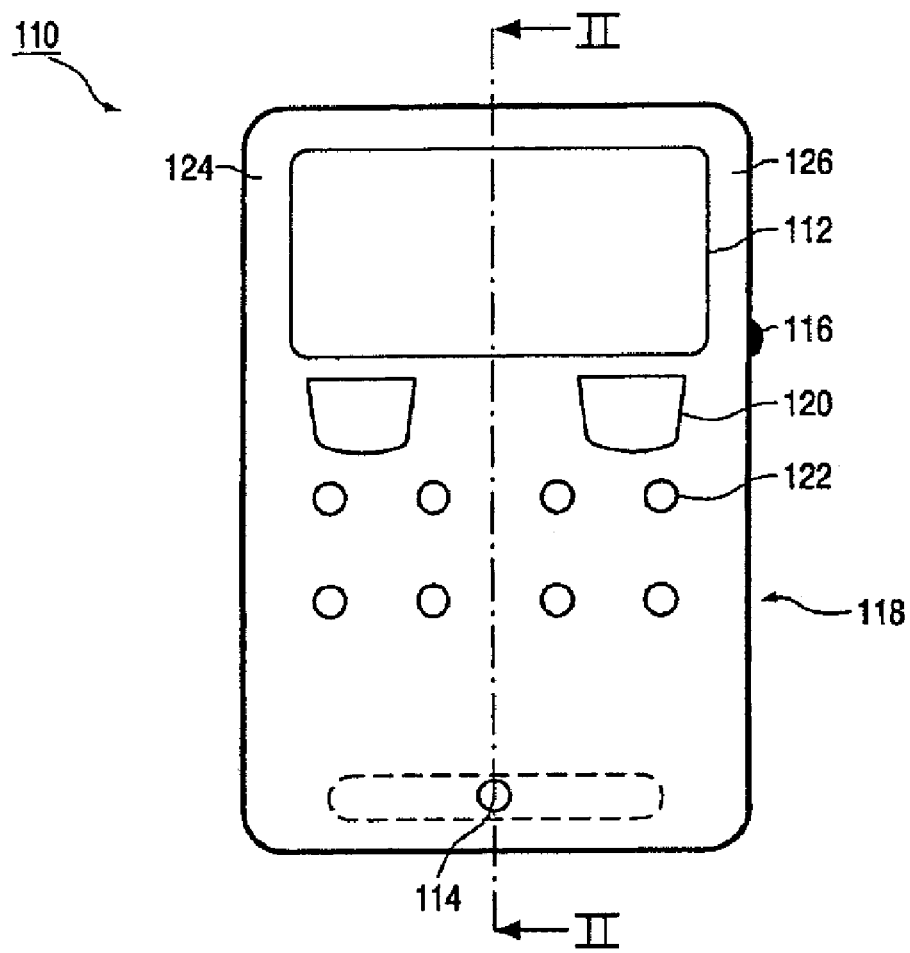
FIG. 13 shows a top view of a mobile phone having an optical keyboard.

FIG. 13 shows a front view of an embodiment of a mobile phone apparatus comprising a display panel 112, a microphone 114, an optical input device, represented by the device window 116, and an number pad 118. The number pad is a simplified type of 20 keyboard and comprises a smaller number of keys, for example dial keys 122 and a few other keys 120. The number of keys may be larger than shown in FIG. 13. Instead of a number pad, the apparatus may also comprise a keyboard having more capabilities.

The optical input device can provide great advantages when integrated in a mobile phone, which is provided with a standard protocol, such as the WAP protocol or the I-mode Internet protocol. By means of such a protocol the mobile phone can be used as a terminal for a worldwide communication network, such as the Internet. The window 116 of the optical input device can be embedded in a side surface 126 of the casing 124 of the mobile phone, as shown in FIG. 13. It is also possible to arrange this window in the surface of this casing wherein the number pad is accommodated. This window is preferably a convex surface, as shown in FIG. 13. This has the advantage that the window can not collect dirt and grease and that it can easily be detected by a human finger. The number pad or keyboard 118 is an optical keyboard.

To demonstrate the impact of the invention on the type of apparatus discussed here, first the optical keyboard described in the pending PCT patent application having filing number PCT/IB02/01859 will be shortly discussed.

Figure 14:
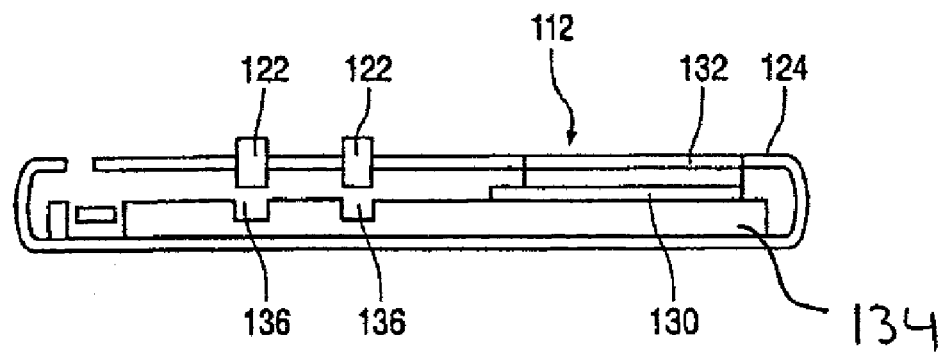
FIG. 14 shows a cross-section of this mobile phone.

FIG. 14 shows a cross-section, along the line II-II" of FIG. 13, of the mobile phone. The display 112 may be a liquid crystal display comprising a layer of liquid crystal material (not shown) arranged between two substrates 130, 132. In this embodiment the display is positioned on a transparent carrier (substrate) 134, which is provided with recesses 136 at the positions of the keys 122. The substrate 134 is made, for example, of transparent plastics and comprises a light guide portion and spaces for at least one light source and detector.

Figure 15:
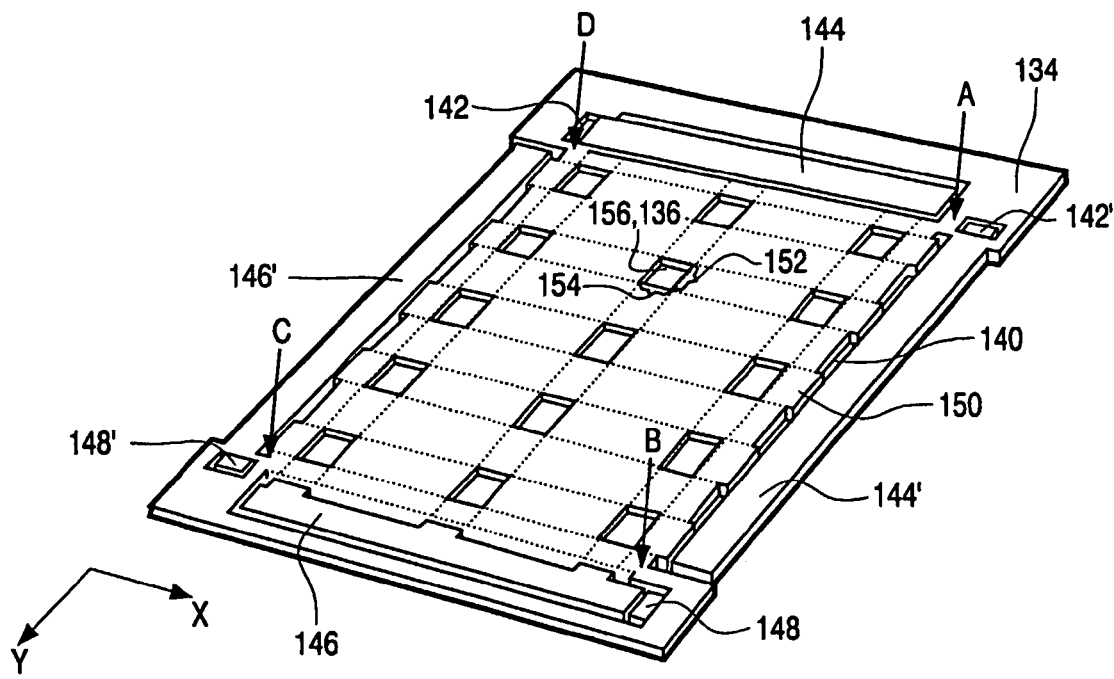
FIG. 15 shows a top view of an embodiment of the light guides in this mobile phone.

In the top view shown in FIG. 15 the light guide portion 140 of the keyboard (hereinafter keyboard light guide) is situated within the rectangular ABCD. At side AD of the keyboard light guide a further light guide 144 is arranged. This light guide (hereinafter source light guide) receives radiation from a source, for example a LED, which is arranged at position 142 in the substrate. A similar source light guide 144' may be arranged at the side AB of the keyboard light guide to receive radiation from a second light source, which is arranged at position 142' in the substrate.

The keyboard light guide 140 is constructed, for example is provided with protruding elements, such that light from the source light guides is coupled into the keyboard only at positions of light paths 152 in the X direction and light paths 154 in the Y direction. At positions 156 where light paths 152 cross light paths 154 a recession is present, as already shown in FIG. 14. Along side BC of the keyboard light guide 140 a further light guide 146 is arranged. This light guide (hereinafter detector light guide) receives radiation from the keyboard light and transport this radiation to an optical detector, for example a photo diode, arranged at position 148 in the substrate 134. A similar detector light guide 146' may be arranged at the side CD of the keyboard light guide 140 to transport radiation from the latter guide to an optical detector arranged at position 148' in the substrate. To improve coupling of radiation from the keyboard light guide into the detector light guides the latter may be provided with protruding elements.

When a key 122 is pushed, it moves into the keyboard light guide and into the light paths crossing at the key position 136. Such a key will, partially or totally, reflect light travelling along these paths. As a consequence, the amount of radiation received by the optical detectors at positions 148 and 148' will change so that the output signals of these detectors will change. As the source light guides are illuminated from one side by their associated light sources, the intensity of the radiation coupled into the keyboard light guide decreases with increasing distance of the light paths 152 and 154 from the positions 142' and 142, respectively of the light sources. Thus, the change in amplitude of the detector output signal caused by pushing a particular key depends on the distance of this key from the light source.

The output signals of the detectors, or photo diodes, are supplied to electronic circuits for measuring, if necessary after amplification, the changes in these signals for both the light paths 152 and light paths 154 thus allowing to determine which key of the board has been pushed.

The key portions that are pushed into the keyboard light guide may be provided with a reflective material to improve their capability to reflect the radiation.

The light sources (LED's) may be pulsed sources.

Instead of by means of photodiodes at positions 148 and 148', the radiation from the keyboard light guide, which is to be measured, can also be guided to other positions, for example by means of reflectors or other optical components. For example, if the display 112 is controlled by a matrix of thin film transistors, this matrix may be enlarged with additional transistors for measuring radiation from the keyboard. This option is attractive when substrate 134 is used as display substrate instead of substrate 130 in FIG. 14. When necessary the design of the additional transistors can be optimized for their special function.

Figure 16:
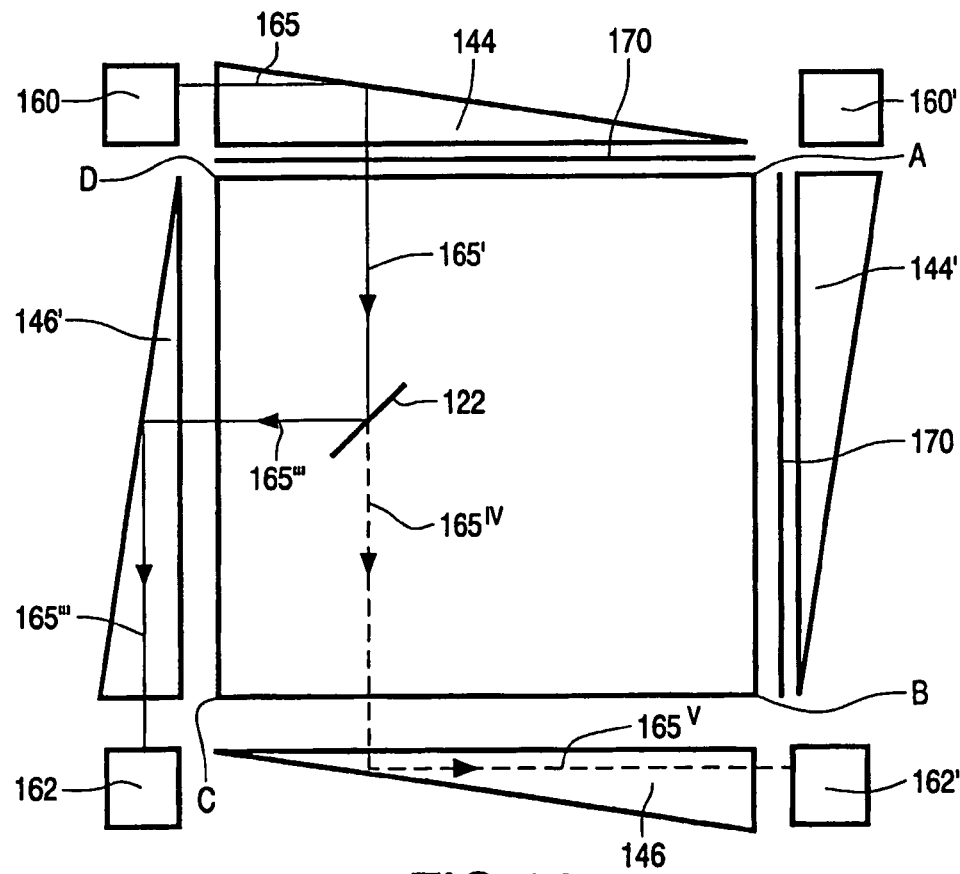
FIG. 16 shows a top view of another embodiment of these light guides.

To couple radiation portions from the source and having different intensities into the different Y light paths 154, the source light guide 144 may show a decreasing thickness, as shown in FIG. 16. A beam portion 165 from a source (LED) 160 is reflected as beam 165' into an Y light path 154 by the skew upper side of the source light guide 144 towards a key in that light path. When the key is pushed down its reflecting portion partially reflects the radiation as beam $165^{II}$ towards the detector light guide 146'. The skew left side of this light guide reflects the radiation as beam $165^{III}$ towards the detector 162. To improve the reliability of the measurement, also the radiation passed by the key reflective portion, as beam $165^{IV}$, can be measured. This beam is reflected by the skew surface of the detector light guide 146' towards the second detector 162'. In the same way the pushed down situation of the key can be detected via the X light path by means of the radiation source 160', the source light guide 144', the detector light guide 146 and the detector 162'. For this type of detection the light sources 160 and 160' should be switched on and off alternately.

It is not necessary to detect the position of the key continuously, it suffices to do such detection a number of times per second.

The radiation beams sent along the different X and Y light paths 152 and 154 can be distinguished not only by different intensities, but also by different frequencies. This can be realized by arranging a colour filter 170 between the source light guide 144, 144' and the keyboard light guide 140. This filter shows over its lengths a varying colour, for example, from (infra) red to (ultra) violet. In the detector branch(es) also colour discrimination should be realized. There are several possibilities to set the intensities of the radiation beams incident on the different X and Y light paths, especially by giving the reflecting surface of the source light guides a specific structure and/or shape.

According to the invention the design of an optical number pad or keyboard shown in FIGS. 13-16 or a keyboard of another type can be simplified considerably by integrating the keyboard and the optical input device. As the beam(s) for determining the conditions of the keys is (are) supplied by the diode laser(s) and measured by means of the detector(s) of the input device, the keyboard itself no longer needs to comprise radiation sources and detectors. As the position of a pushed key is measured in a way different from that discussed at the hand of FIGS. 13-16, the source light guide 144, 144' having the specific construction and the detector light guide 146, 146' are no longer needed. Also the electronic circuits for processing the output signals of the detectors 148,148' are no longer needed because information about the position of a pushed key is derived from the output signal(s) of the input device. In this way considerable space and costs for the optical keyboard can be saved. This holds also for other types of optical keyboards. Moreover, guiding the measuring beam(s) along the positions of the keys means that the distance between the diode laser and the object (finger) to be measured is substantially increased, which results in a substantial increase of the accuracy and reliability of the input device. Integration of the optical keyboard and the optical input device thus provides advantages not only for the keyboard, but also for the input device.

Figure 17:
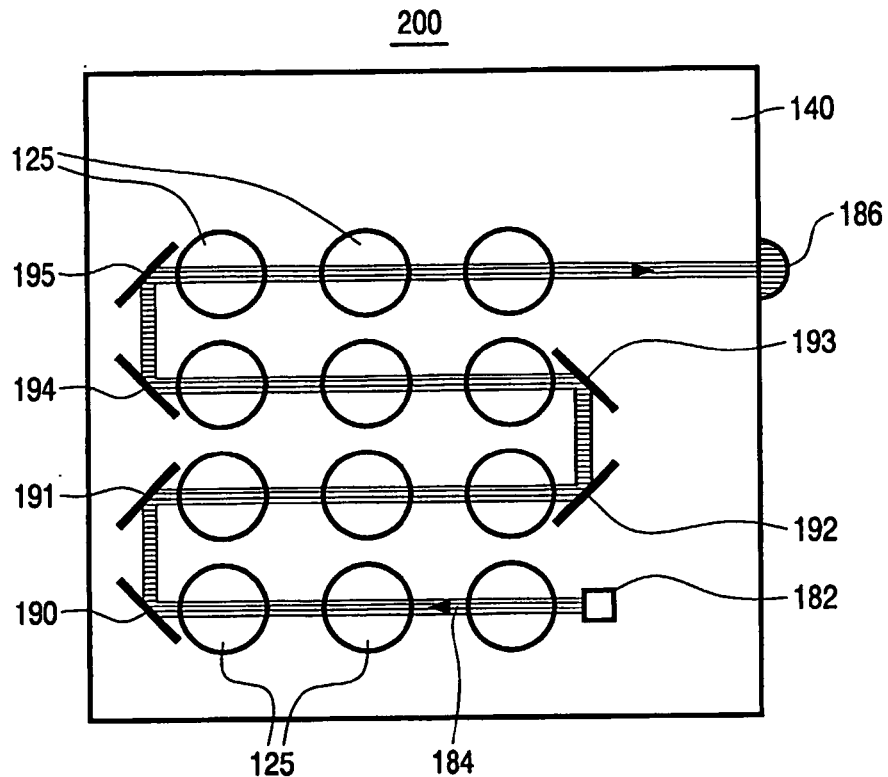
FIG. 17 shows an embodiment of an integrated optical keyboard and optical input device having one sensor unit.

FIG. 17 shows a first embodiment 180 of an optical keyboard wherein an input device is integrated. The optical input device comprises a diode laser and photo diode assembly 182 and a device window 186. The assembly 182 is arranged in the keyboard light guide 140 so that the measuring beam 184 emitted by the diode laser propagates through the light guide 140. The assembly 182 may also contain lens means (not shown) to collimate the measuring beam. Before the device window 186 lens means (not shown) may be arranged in the measuring beam path to converge the measuring beam on the device window. The measuring beam is guided along the positions of all keys by means of mirrors 190-195 before it arrives at the window.

Scroll movement of the object of finger across the window 186 is measured in the same way as described at the hand of FIGS. 1-8. In the embodiment of FIG. 17 the single sensor unit also measures a click motion. As described herein before, use is made then of additional information, like a change in the laser drive current, the occurrence of a low-frequency modulation in the detector signal etc., to detect a temporally presence of the finger on the device window and thus whether a click movement takes place. To measure whether and which key is pressed used is made of the undulations shown in FIG. 6, which undulations are caused by reflecting measuring radiation returning into the laser cavity irrespective of a finger movement. Up to now these undulations, which may be called zero order undulations, have been used to distinguish between a forward and backward scroll movement. To that end the zero order undulations are added to or subtracted from the undulations caused by a scroll movement, dependent on the direction of the movement. According to the invention a second use is made of zero order undulations in the detector output signal. The keys are provided with optically scattering or retro-reflecting surfaces, which when a key is pressed, ranges in the keyboard light guide and scatter and reflect, respectively measuring radiation to the laser cavity. As the number of zero order undulations is dependent on the distance between the diode laser and the position at which scattering occurs, the position of a pressed key and thus the number of this key can be determined by counting the number of zero order undulations. As in the input device described herein before already undulations are counted, to distinguish forward and backward movements, no additional means are needed for determining which key is pressed. Only the software that evaluates the detector-signal undulations has to be adapted, which is a simple job for the person skilled in the art.

The object or finger, which movement is to be measured is the scattering or reflecting surface most remote from the laser cavity and is now arranged at a considerably larger distance from the laser cavity. This provides the great advantage that the number of zero-order undulations caused by presence of the finger is considerably increased, which largely facilitates recognition of upward or downward scroll movement. In this way the quality and reliability of the scroll signal of the integrated input device and optical keyboard is considerably increased compared with that of the input device per se.

As for the scroll/click signal the number of zero-order undulations is larger than the number of these undulations caused by any pressed key, the signal caused by a movement of the finger can easily be distinguished from a signal caused by a pressed key.

Figure 18:
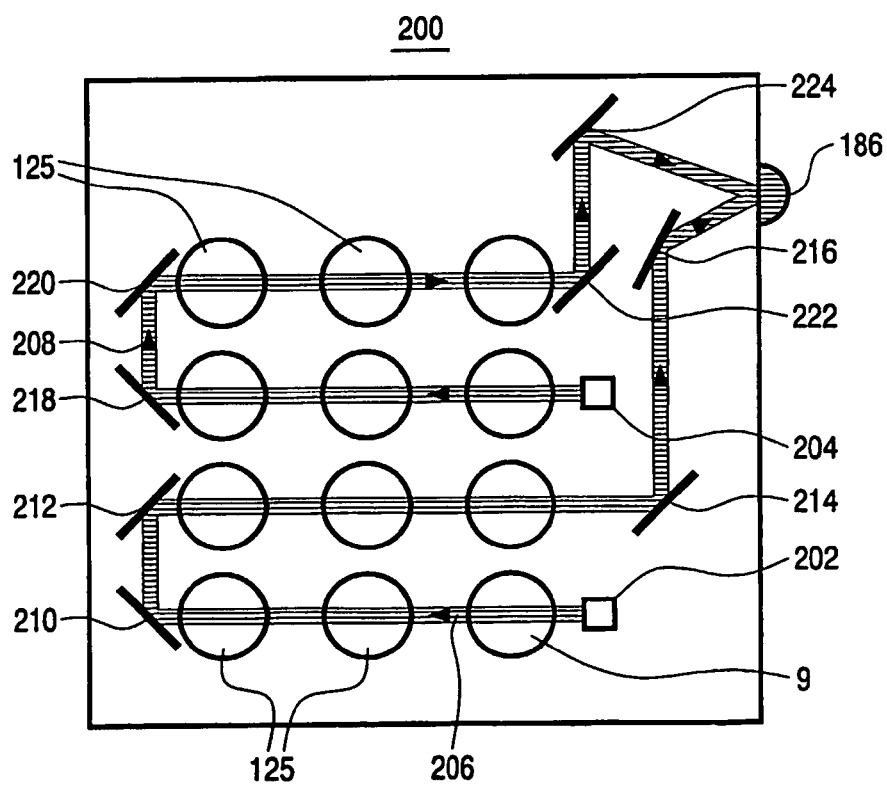
FIG. 18 shows an embodiment of an integrated optical keyboard and optical input device having two sensor units.

FIG. 18 shows an embodiment 200 of the optical keyboard with integrated input device, which comprises two diode lasers 202, 204 and associated photo diodes (not shown). The input device can be used for measuring a click movement and scroll movement either along one axis or along two axes. The keys 125 are now distributed over two groups. The condition of the keys of the first group, the lower group in FIG. 18, is now measured by means of diode laser 202 and the associated detector. The measuring beam 206 from this diode laser is guided along the positions of the keys of the first group by means of mirrors 210 and 212 and is then directed to the device window 186 by means of the mirrors 214 and 216. Diode laser 204 and the associated detector are used to measure the condition of the keys of the second group of keys, the upper group in FIG. 18. The measuring beam 208 is guided along the positions of these keys by means of the mirrors 218 and 220 and is then directed to the device window by means of the mirrors 222 and 224. In this embodiment the position of a pressed key is obtained by determining for which one of the measuring beams the radiation path is interrupted and measuring the number of zero-order undulations in the detector signal associated with this measuring beam.

Figure 19:
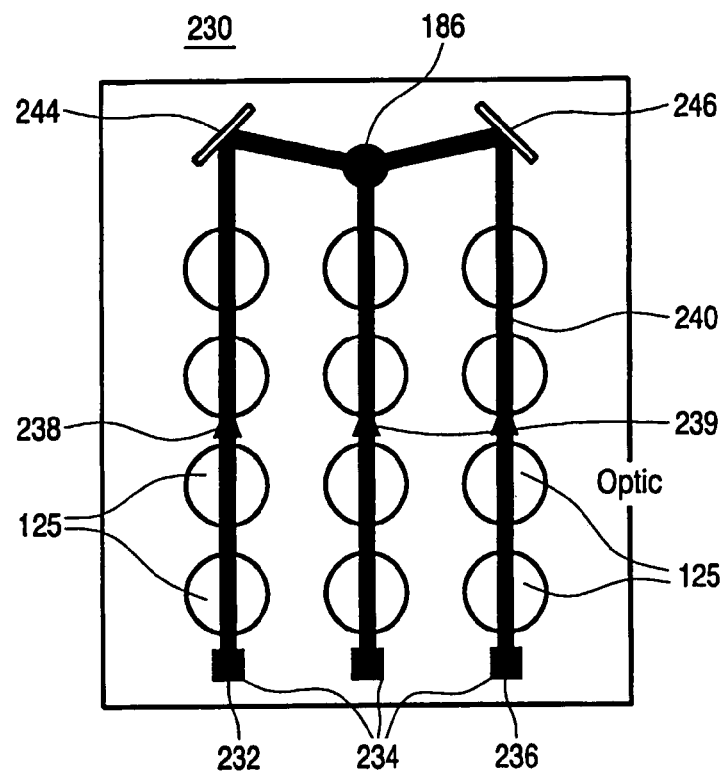
FIG. 19 shows an embodiment of an integrated optical keyboard and optical input device having three sensor units.

FIG. 19 shows an embodiment 230 of the optical keyboard with an integrated optical input device, which comprises three diode lasers 232, 234, 236 and associated photo detectors (not shown) The keys 125 are now distributed over three parallel groups. The diode lasers are arranged relative to the groups such that the measuring beams 238, 239 and 240 pass the positions of the keys of the first (left hand) group, the second (central) group and the third (right hand) group, respectively. Measuring beam 239 is directly incident on device window 186 and measuring beam 238 and measuring beam 240 is directed to this window by means of mirror 244 and mirror 246, respectively. As in the embodiment of FIG. 18, the position of a pressed key is obtained by determining for which one of the measuring beams the radiation path is interrupted and measuring the number of zero-order undulations in the detector signal associated with this measuring beam. The measuring beams 238, 239 and 240 can be used to measure scroll movement in the X direction, a scroll movement in the Y direction and a click movement in the Z-direction, respectively. It is also possible to use one or two measuring beams to measure both a scroll movement and a click movement and to use the third measuring beam for obtaining additional information, for example to enhance the reliability with which one of the movements is measured.

Figure 20:
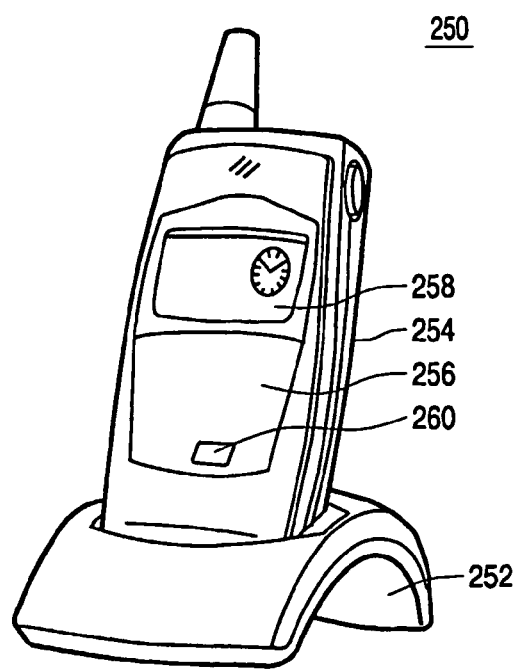
FIG. 20 shows a cordless phone apparatus equipped with an integrated optical keyboard and optical input device.

Although the invention has been described at the hand of a mobile phone apparatus, it can be used in several other apparatus, especially small battery powered apparatus comprising an optical input device and an optical keyboard. An example of such an apparatus is a cordless phone apparatus comprising the same or similar functions as the mobile phone apparatus. A cordless phone apparatus 250 is shown in FIG. 20. This apparatus is composed of a base station 252, which is connected to a phone or cable network and the movable apparatus 254 which can be used within an area with a radius of, for example, less than 100 m from the base station. Apparatus 254 comprises an optical keyboard 256 and a display device 258. As is the case for the mobile phone apparatus, the apparatus 254 may be provided with the WAP protocol or the I-mode protocol for access to the Internet and is provided with an optical input device 260. This input device, of which only the window is shown, is integrated with the optical keyboard as described herein above. The device window may also be arranged in a side surface of the apparatus 254. Like the mobile phone apparatus, the apparatus 254 should be small and light-weight so that implementation of the invention in the cordless phone apparatus provides the same advantages as in the mobile phone apparatus.

Figure 21:
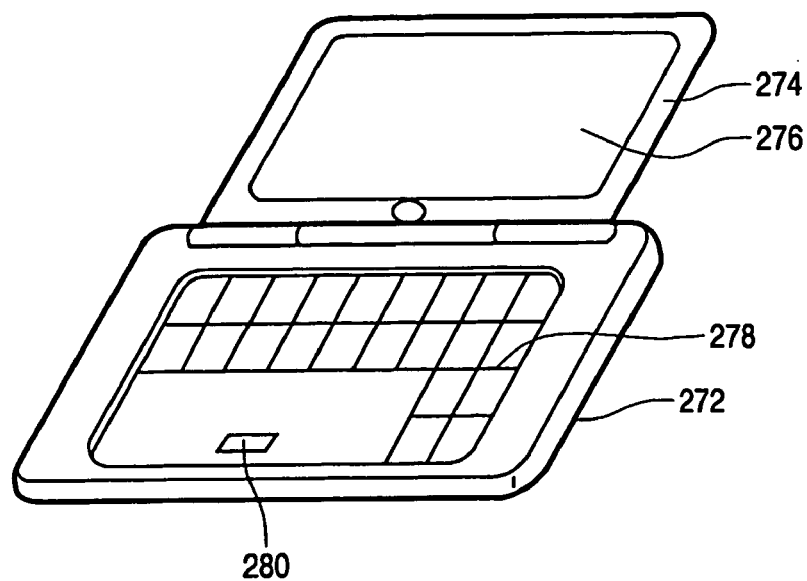
FIG. 21 shows a laptop computer equipped with an integrated optical keyboard and optical input device.

The invention may also be used in a portable computer, known as notebook or laptop, an embodiment 270 of which is shown in FIG. 21. The notebook comprises a base portion 272 and a cover portion 274 with a LCD display 276. The base portion accommodates the different computer modules and an optical keyboard 278. In this keyboard, an optical input device 280 is arranged which replaces the conventional mouse pad. The input device may be arranged at the position of the conventional mouse pad or at any other easily accessible position. The optical keyboard and the optical input device are integrated as described herein before for a mobile phone apparatus.

A hand-held computer, for example the type known as personal digital assistant (DPA) is a smaller version of the notebook. Such a handheld computer may also be provided with an optical input device and other optical devices mentioned with respect to the notebook computer. As, moreover a hand-held computer should have smaller weight and size and consume lesser energy than a notebook computer, use of the invention in a hand-held computer provides even larger advantages.

The invention can also be used in small-sized game computers.

Figure 22:
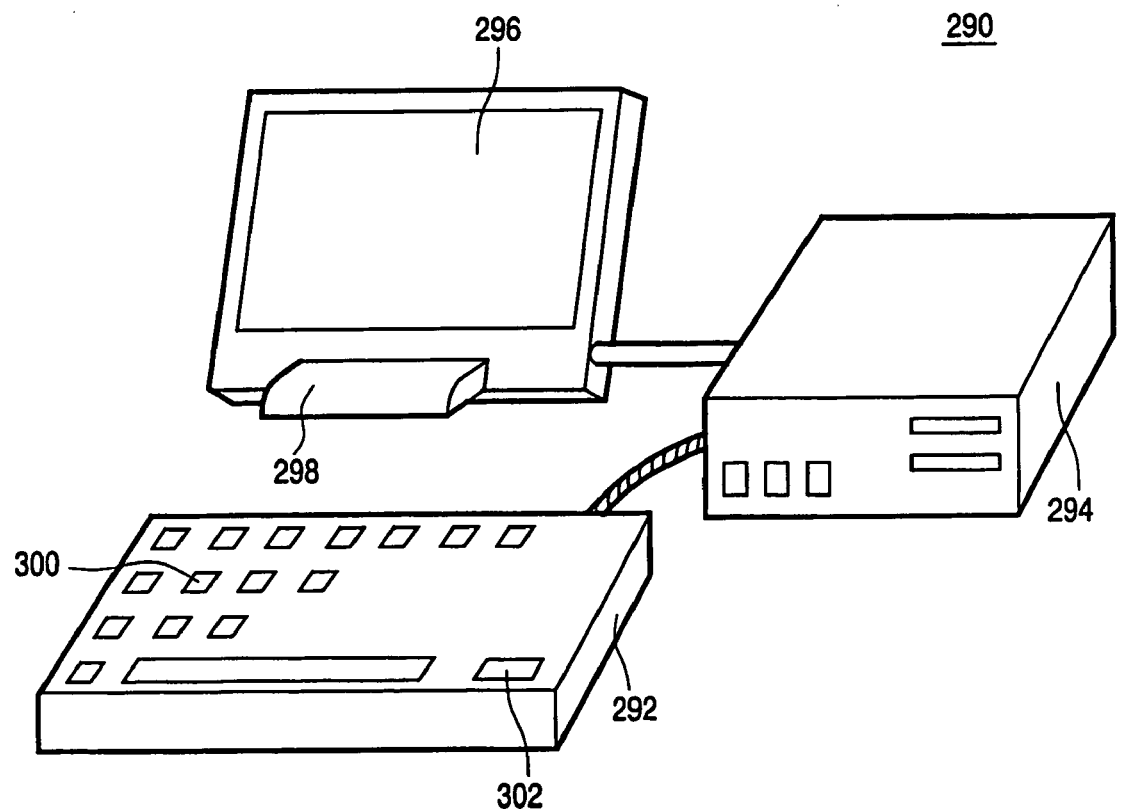
FIG. 22 shows a desktop computer equipped with an integrated optical keyboard and optical input device.

FIG. 22 shows a desktop computer configuration 290 wherein an optical input device is used to replace the conventional trackball mouse. The configuration is composed of a keyboard casing 292, a computer box 294 and a monitor 296. The monitor may be a flat LCD monitor fixed in a support 298, as shown in the Figure, or a CRT monitor. An optical input device 302, of which only the device window is shown, is arranged in the keyboard casing 292. According to the invention, the keyboard 300 is an optical keyboard and the input device 302 is integrated with the keyboard as described herein before.

Figure 23:
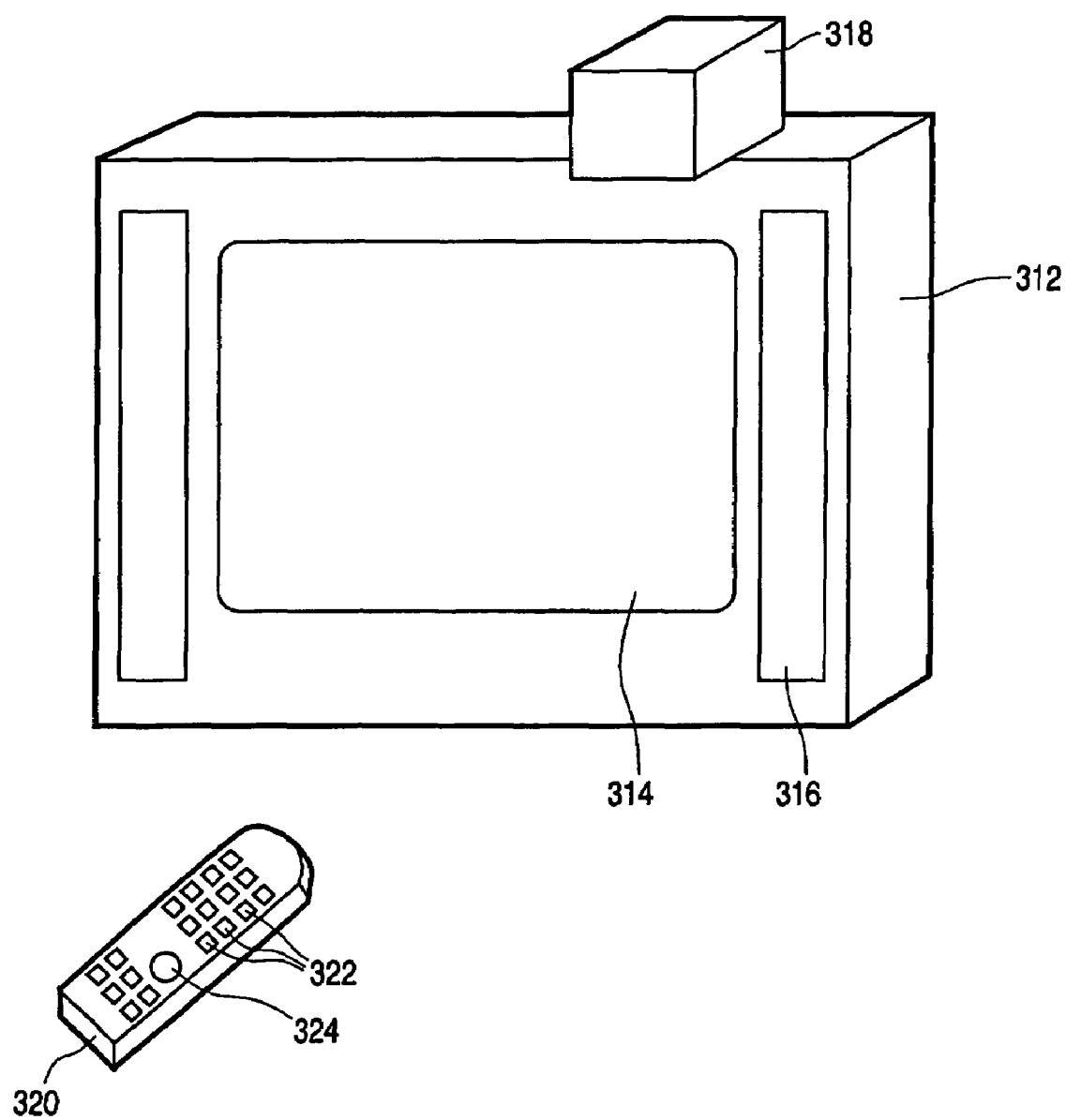
FIG. 23 shows a remote control equipped with an integrated optical keyboard an input device.

The invention can also be used in a remote control unit 320 for use in a conventional TV set configuration 310, shown in FIG. 23 and which comprises a receiver and display apparatus 312 provided with a display 314 and speakers 316. The configuration is equipped with a set top box 318 to make the apparatus suitable for, for example, Internet communication. This box provides access to the Internet via a phone or cable network and converts the signal received from the Internet into a signal that can be processed by the TV set in order to display the Internet information. As a user of the Internet TV should have the input device for Internet commands at hand, this input device 324 should be integrated in the remote control unit 320. The number pad or keyboard 322 of the remote control is an optical keyboard and, according to the invention, the optical input device is integrated with the keyboard in the way as described herein before.

In general, the invention can be used in any apparatus, which is equipped with an optical input device and an optical keyboard.

The invention claimed is:

1. An apparatus comprising an optical input device controlled by a moving object near a window and an optical keyboard, wherein the optical input device comprises at least two optical sensor units comprising at least two diode lasers for supplying at least two measuring beams and converting means for converting measuring beam radiation reflected by the object into an electric signal, which converting means are constituted by the combination of a laser cavity and measuring means for measuring changes in operation of the laser cavity, which are due to interference of reflected measuring beam radiation re-entering the laser cavity and the optical wave in this cavity and which are representative of the movement of the object, wherein at least two paths of the at least two measuring beams from the at least two diode lasers to the window extend through at least two light guides of the optical keyboard, said at least two paths including mirrors and passing through the window, wherein each key of the optical keyboard along said at least two paths is associated with only a single path of said at least two paths.

2. The apparatus as claimed in claim 1, wherein the at least two sensor units are arranged relative to the optical keyboard such that the at least two measuring beams pass on their way to the device window positions of a first set of keys and positions of a second set of keys, respectively, the first set and the second set together comprising all keys to be controlled.

3. The apparatus as claimed in claim 1, wherein the optical input device comprises at least three sensor units, which are arranged relative to the optical keyboard such that at least three measuring beams of first, second and third sensor units pass, on their way to the device window, positions of a first, a second and a third set of keys, respectively, the first, second and third set comprising all keys to be controlled.

4. The apparatus as claimed in claim 1, wherein the at least one sensor unit of the two sensor units is adapted to measure both a scroll movement and a click movement and provided with additional means, which allow establishing the presence of an object on the window of the device.

5. The apparatus as claimed in claim 4, wherein the additional means are constituted by means for establishing whether the reflected measuring beam radiation shows an amplitude variation of a frequency lower than the frequencies of variations caused by a scroll movement.

6. The apparatus as claimed in claim 4, wherein the additional means are constituted by electronic means for detecting a component in an output signal of said measuring means.

7. The apparatus as claimed in claim 4, wherein said at least one sensor unit is activated by activation pulses and the measuring means perform measurements during time intervals determined by the activation pulses, wherein the additional means comprises counting means and comparing means to establish whether a number of undulations in the output signal measured during a first half and a second half of a said time interval are equal.

8. The apparatus as claimed in claim 5, wherein the said at least one sensor unit comprises a first radiation-sensitive detector for measuring variations in the laser cavity, wherein the additional means is constituted by a second radiation-sensitive detector arranged for receiving measuring beam radiation, which is non-incident on the laser cavity.

9. The apparatus as claimed in claim 5, wherein a radiation-sensitive detector is arranged at a rear side of the laser cavity.

10. The apparatus as claimed in claim 8, wherein the second detector is arranged at a side of the laser cavity where the measuring beam is emitted.

11. The apparatus as claimed in claim 1, wherein the measuring means of the optical input device are means for measuring a variation of an impedance of the laser cavity.

12. The apparatus as claimed in claim 1, wherein the measuring means is a radiation-sensitive detector for measuring radiaation emitted by one laser diode of the at least two diode lasers.

13. The apparatus as claimed in claim 1, wherein the apparatus is a mobile phone.

14. The apparatus as claimed in claim 1, wherein the apparatus is a cordless phone.

15. The apparatus as claimed in claim 1, wherein the apparatus is a laptop computer.

16. The apparatus as claimed in claim 1, wherein the apparatus is a hand-held computer.

17. The apparatus as claimed in claim 1, wherein the apparatus is a keyboard for a desk computer.

18. The apparatus as claimed in claim 1, wherein the apparatus is a remote control for a TV set.

19. The apparatus of claim 1, wherein one of the at least two light guides includes a protruding element, such that one of the at least two measuring beams is coupled into the optical keyboard only at positions where the at least two paths cross each other, the positions including recessions.

20. The apparatus of claim 1, wherein the least two optical sensor units are configured to measure changes in the at least two measuring beams for determining which key of the optical keyboard is pushed.

21. An apparatus having an optical keyboard and an optical input device controlled by a moving object near a window, the optical input device comprising at least two optical sensor units including at least two diode lasers for supplying at least two measuring beams and converting means for converting a reflected beam reflected by the moving object into an electric signal, wherein at least two paths of the measuring beam from the at least two diode lasers to the window include mirrors and pass through the window, wherein each key of the optical keyboard along said at least two paths is associated with only a single path of said at least two paths.

22. The apparatus of claim 21, wherein the at least two paths are independent from each other and meet only at the window.

23. An optical input device controllable by a moving object near a window of an optical keyboard, the optical input device comprising:
at least two diode lasers for supplying a measuring beam for reflection from the moving object; and
at least two detectors configured to convert a reflected beam reflected by the moving object into an electric signal, wherein at least two paths of the measuring beam from the at least two diode lasers to the window include mirrors and pass through the window wherein each key of the optical keyboard along said at least two paths is associated with only a single path of said at least two paths.

24. The apparatus of claim 1, wherein the at least two guides are independent from each other and meet only at the window.

25. The optical input device of claim 23, wherein the at least two paths are independent from each other and meet only at the window.

* * * * *